United States Patent [19]

Yoshizawa et al.

[11] Patent Number: 5,040,147
[45] Date of Patent: Aug. 13, 1991

[54] NONVOLATILE SEMICONDUCTOR MEMORY

[75] Inventors: Makoto Yoshizawa, Tokyo; Katsuaki Mohri, Yokohama; Takeshi Nakashiro, Yokohama; Tadashi Maruyama, Yokohama, all of Japan

[73] Assignee: Kabushiki Kaisha Toshiba, Kawasaki, Japan

[21] Appl. No.: 494,318

[22] Filed: Mar. 16, 1990

[30] Foreign Application Priority Data

Mar. 17, 1989 [JP] Japan .................................. 1-65563

[51] Int. Cl.⁵ ...................... G11C 11/40; G11C 13/00
[52] U.S. Cl. ...................................... 365/185; 365/51; 365/63
[58] Field of Search ............. 365/185, 189.01, 230.01, 365/51, 63

[56] References Cited
U.S. PATENT DOCUMENTS
4,361,847 11/1982 Harari ................................ 365/185

FOREIGN PATENT DOCUMENTS
0280883 7/1988 European Pat. Off. .
57-130473 12/1982 Japan .

OTHER PUBLICATIONS
Patent Abstracts of Japan, vol. 6, Number 230 (E-142) [1108] Nov. 16, 1982.

Primary Examiner—Terrell W. Fears
Attorney, Agent, or Firm—Finnegan, Henderson, Farabow, Garrett and Dunner

[57] ABSTRACT

A nonvolatile semiconductor memory is a programmable and erasable nonvolatile semiconductor memory including a semiconductor substrate of a first conductivity type, source and drain diffusion layers in the semiconductor substrate, and a channel region between the source and drain diffusion layers. A first insulation film is continuously on the channel region and the drain diffusion layer adjacent to the channel region, and a floating gate layer is on the first insulation film. Further, a second insulation film having a thin film portion which is thinner than the first insulation film is on the floating gate layer, and a control gate layer is on the second insulation film.

11 Claims, 7 Drawing Sheets

| OPERATION MODE | S | CG | SG | BL |
|---|---|---|---|---|
| ERASING (ELECTRON INJECTION) | 0<sup>V</sup> | 20<sup>V</sup> | 20<sup>V</sup> | 0<sup>V</sup> |
| PROGRAMMING (ELECTRON EMISSION) | 5<sup>V</sup> | 0<sup>V</sup> | 20<sup>V</sup> | 20<sup>V</sup> |
| READOUT | 0<sup>V</sup> | 0<sup>V</sup> | 5<sup>V</sup> | 1<sup>V</sup> |
F I G. 3
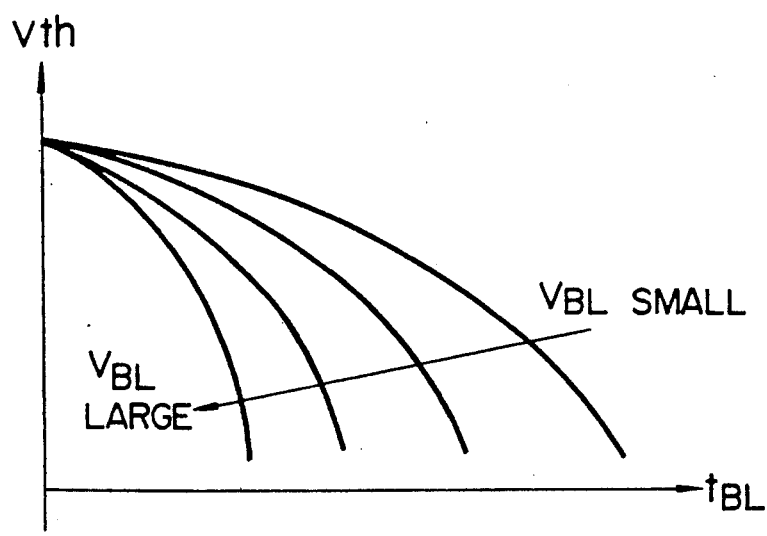
F I G. 4
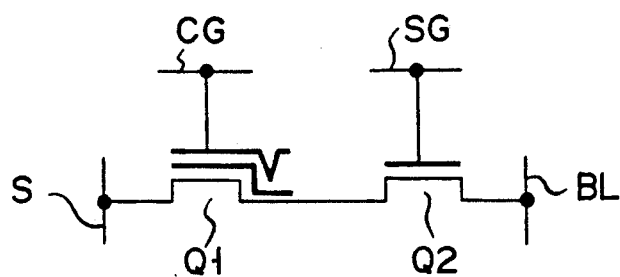
F I G. 7

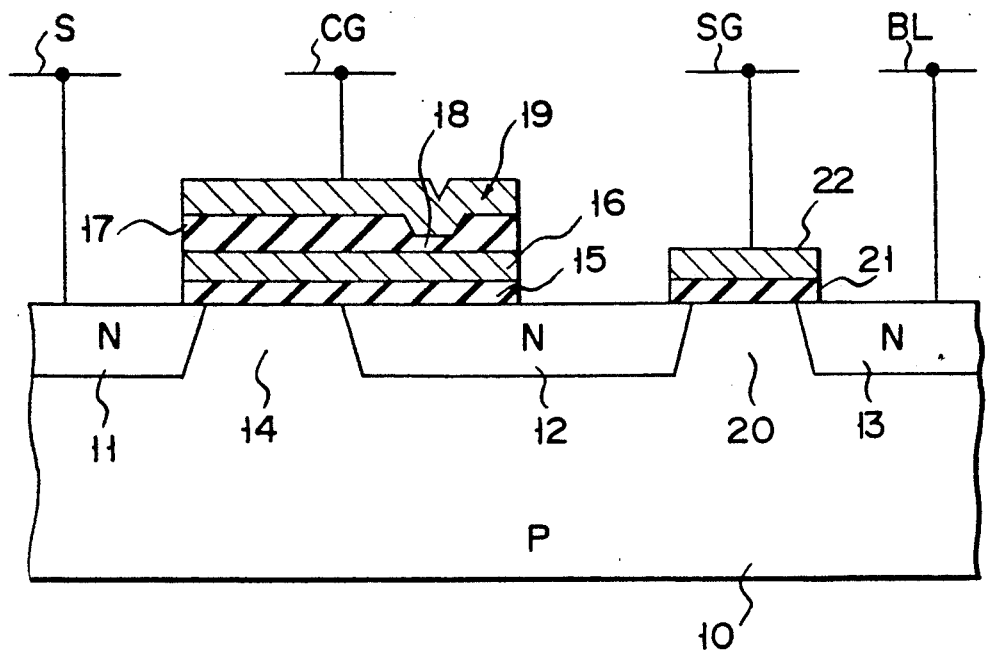
F I G. 5
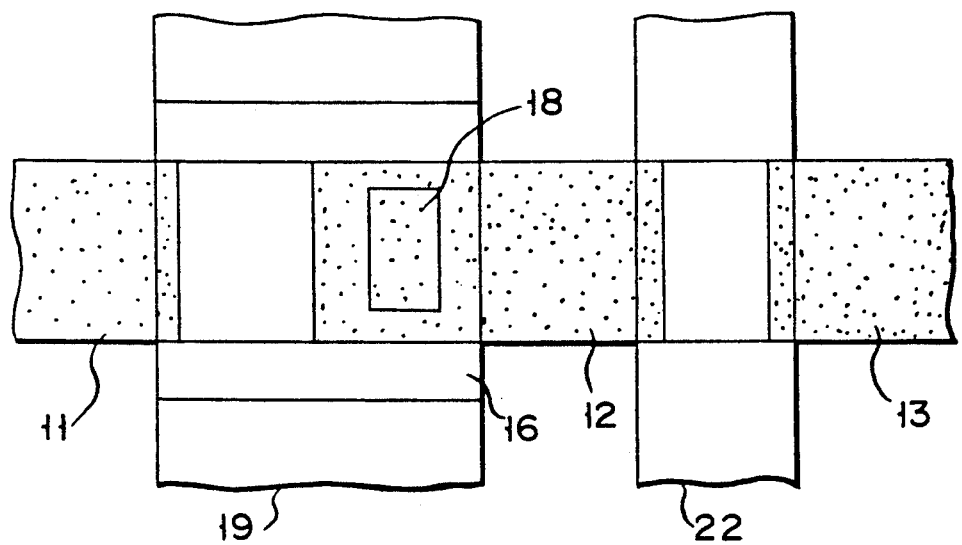
F I G. 6

| OPERATION MODE | S | CG | SG | BL |
|---|---|---|---|---|
| ERASING (ELECTRON INJECTION) | FL | 0V | 20V | 20V |
| PROGRAMMING (ELECTRON EMISSION) | 0V | 20V | 20V | 0 |
| READOUT | 0V | FL | 5V | 5V |

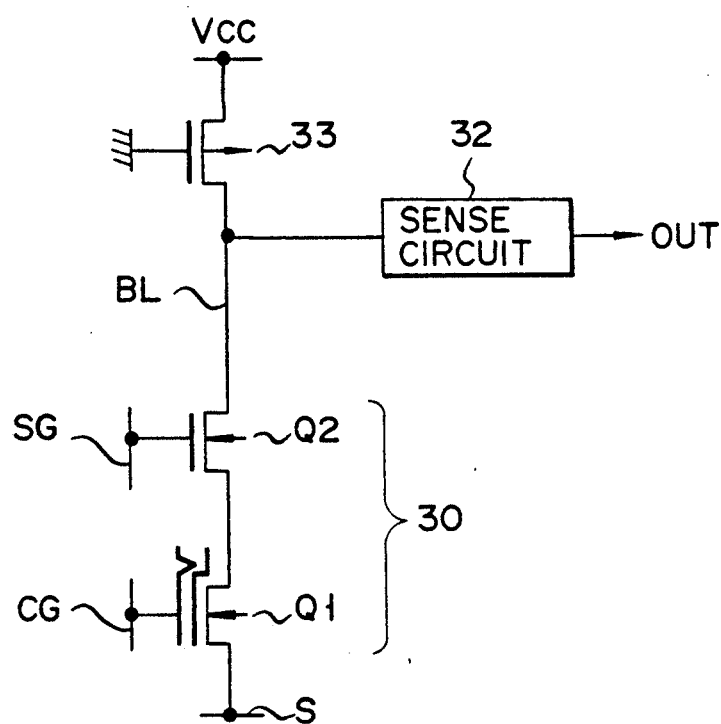
F I G. 10
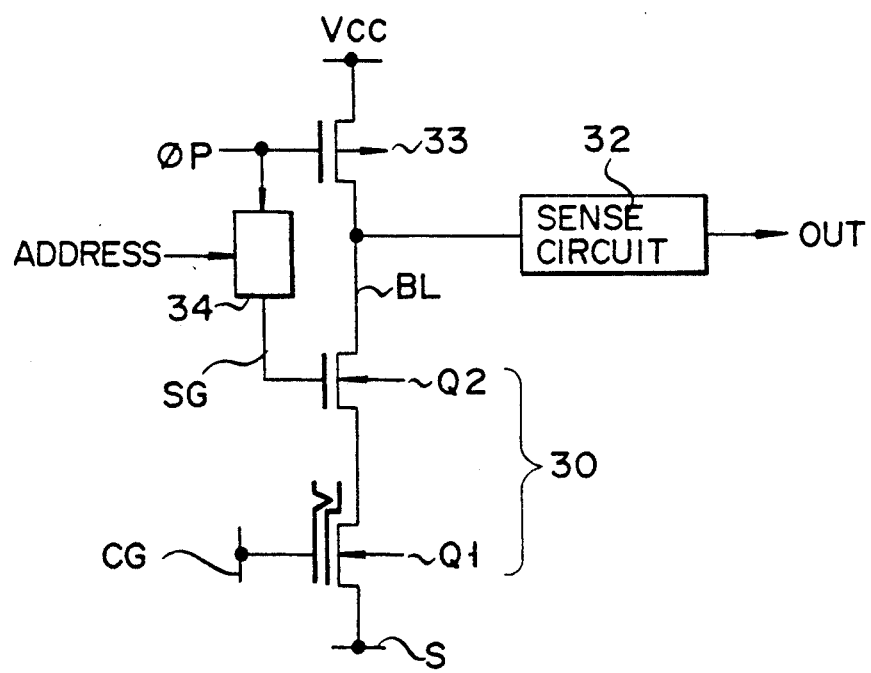
F I G. 11

NONVOLATILE SEMICONDUCTOR MEMORY

Background of the Invention

1. Field of the Invention

This invention relates to a nonvolatile semiconductor memory using nonvolatile transistors and more particularly to a nonvolatile semiconductor memory in which data can be electrically programmed.

2. Description of the Related Art

A nonvolatile semiconductor memory in which data can be electrically programmed is well known in the art as an electrically erasable and programmable read only memory ($E^2$PROM). Memory cells used for constituting the $E^2$PROM can be formed with various types of constructions, and the memory cells are generally formed with a construction in which a floating gate is partly overlapped with a drain diffusion layer with a thin insulation film disposed therebetween.

FIG. 1 is a cross sectional view of a conventional memory cell with the above construction. In FIG. 1, 50 denotes a P-type semiconductor substrate. N-type diffusion layers 51, 52 and 53 are separately formed in the surface area of the substrate 50, and a channel region 54 is provided between the diffusion layers 51 and 52. A floating gate 56 formed of polysilicon is disposed over the channel region 54 with a relatively thick insulation film 55 disposed therebetween. The floating gate 56 is also formed over the diffusion layer 52 with a thin film portion 57 thinner than the insulation film 55 disposed therebetween. Further, a control gate 59 formed of polysilicon is disposed over the floating gate 56 with a relatively thick insulation film 58 disposed therebetween.

A channel region 60 is provided between the diffusion layers 52 and 53, and a select gate 62 formed of polysilicon is disposed over the channel region 60 with a relatively thick insulation film 61 disposed therebetween.

With the above construction, the diffusion layer 51 is connected to a source line S and the diffusion layer 53 is connected to a bit line BL. Further, the control gate 59 and select gate 62 are respectively connected to control gate line CG and select gate line SG.

FIG. 2 is a circuit diagram of an equivalent circuit of the element shown in FIG. 1. In FIG. 2, a transistor Q11 is a floating gate type MOS transistor having the diffusion layers as the source and drain thereof and constituting a memory cell transistor for storing data. Further, a transistor Q12 is an ordinary type MOS transistor having the diffusion layers 52 and 53 as the source and drain thereof and constituting a selection transistor for selecting the memory cell transistor Q11. The MOS transistors Q11 and Q12 are serially connected between the source line S and the bit line BL.

The memory cell with the above construction has a data erasing mode, data programming mode and data readout mode. FIG. 3 shows voltages applied to the source line S, control gate line CG, select gate line SG and bit line BL in the respective operation modes. In this case, three types of power sources of ground voltage GND, $V_{CC}$ and $V_{PP}$ are used in an integrated circuit containing an $E^2$PROM, and in an ordinary case, GND is 0V, $V_{CC}$ is +5V and $V_{PP}$ is +20V. In general, the voltage $V_{PP}$ is not supplied as an exterior power source voltage, but is obtained by stepping up the voltage $V_{CC}$ in the integrated circuit.

The data erasing mode is also called an electron injection mode in which the threshold voltage Vth of the memory cell transistor Q11 is raised by injecting electrons into the floating gate 56 of the transistor Q11. In this case, voltages of 0V, +20V, +20V and 0V are respectively applied to the bit line BL, select gate line SG, control gate line CG and source line S. When a voltage of +20V is applied to the select gate line SG, the selection transistor Q12 is turned on and the diffusion layer 52 is set to 0V by the voltage of the bit line BL. At this time, the floating gate 56 is held at a high potential by the voltage applied to the control gate line CG. Therefore, an intense electric field is applied across the thin film portion 57 of the insulation film 52 lying between the floating gate 56 and diffusion layer 52 so that a tunnel current may flow from the diffusion layer 52 towards the floating gate 56, thus injecting electrons into the floating gate 56. As a result, the threshold voltage Vth of the memory cell transistor Q11 is raised to approx. 8V, for example.

The data programming mode is also called an electron emitting mode in which the threshold voltage Vth of the memory cell transistor Q11 is lowered by emitting electrons injected into the floating gate 56 of the transistor Q11. In this case, voltages of +20V, +20V and 0V are respectively applied to the bit line BL, select gate line SG and control gate line CG, and the source line S is applied with a voltage of +5V or set in the electrically floating state. When a voltage of +20V is applied to the select gate line SG, the selection transistor Q12 is turned on and the diffusion layer 52 is set to +20V by the voltage of the bit line BL. Therefore, an intense electric field is applied across the thin film portion 57 in a direction opposite to that set in the case of the erasing mode so that a tunnel current may flow from the floating gate 56 towards the diffusion layer 52, thereby emitting electrons from the floating gate 56. As a result, the threshold voltage Vth of the memory cell transistor Q11 is lowered and set to approx. −5V, for example.

In the data readout mode, voltages of +1V, +5V, 0V and 0V are respectively applied to the bit line BL, select gate line SG, control gate line CG and source line S. When a voltage of 5V is applied to the select gate line SG, the selection transistor Q12 is turned on and the diffusion layer 52 is set to +1V by the voltage of the bit line BL. At this time, if electrons are previously injected into the floating gate 56 and the threshold voltage Vth is raised, then the memory cell transistor Q11 is not turned on. Therefore, no current flows between the bit line BL and source line S, thereby keeping the voltage of the bit line BL at +1V. In contrast, if electrons are previously emitted from the floating gate 56 and the threshold voltage Vth is lowered, the memory cell transistor Q11 is turned on. Therefore, a current flows between the bit line BL and source line S, causing the bit line BL to be set to 0V which is equal to the voltage of the source line S. That is, in the data readout mode, the voltage of the bit line BL is set to a voltage of 1V or 0V depending on the data storing state of the selected memory cell transistor Q11. Then, data detection of logic value "1" or "0" is effected by amplifying the voltage of the bit line BL by means of a sense circuit (not shown) connected to the bit line BL.

A problem occurring in this case is to amplify a potential difference between 1V and 0V on the bit line BL by means of a sense circuit. That is, in the sense circuit, it is necessary to determine the level by amplifying a potential difference which is as low as 1V.

Now, the reason why the voltage of the bit line BL must be suppressed to approx. 1V in the readout mode instead of setting the same to +5V which is the normal power source voltage is explained. If a voltage of the bit line BL is set to +5V in the readout mode, the potential of the diffusion layer 52 is also set to 5V. Then, an electric field between the voltage of 0V of the control gate line CG and the voltage of +5V of the diffusion layer 52 is applied across the thin film portion 57 via the floating gate 56. That is, the electric field is applied to the thin film portion 57 in the same direction as in the case of the programming mode (electron emitting mode) and the different point is that the intensity of the electric field is weaker than in the case of the programming mode. Therefore, if the memory cell transistor is kept in the programming mode for a long period of time, electrons which have been previously injected will be gradually emitted by the tunnel effect. As a result, the threshold voltage Vth is gradually lowered and a logically erroneous operation may be caused when a certain length of time has passed. Such a phenomenon is called a soft write (weak write) phenomenon, and the resistance to the soft write phenomenon relating to the length of sustaining time thereof is called a read retention characteristic (data holding characteristic in the readout mode).

The soft write phenomenon is explained with reference to FIG. 4. FIG. 4 is a characteristic diagram showing the relation between the threshold voltage Vth of a memory cell transistor in which electrons are injected into the floating gate and total time $t_{BL}$ in which a voltage is applied to the bit line with a voltage $V_{BL}$ of the bit line set as a parameter. As is clearly seen from FIG. 4, in order to prevent electrons from being emitted from the floating gate or suppress the electron emission to a minimum, it is necessary to set the bit line voltage $V_{BL}$ as low as possible. Therefore, in order to suppress occurrence of the soft error phenomenon, the bit line voltage in the readout mode may be set to a low level. However, if the voltage is lowered, a voltage difference between the bit line voltage set when an electron injected cell is selected and that set when an electron emitted cell is selected becomes smaller, reducing the voltage margin at the time of determining the logic level of "1" or "0" by means of the sense circuit. For this reason, in the prior art, a voltage of approx. +1V is applied to the bit line in the data readout mode to take the sufficiently effective measure for the read retention characteristic, and at the same time, the sense circuit is formed with a high performance to cope with the problem that the voltage margin becomes small, and thus a severe load is imposed on the sense circuit itself.

As described above, in the prior art, an extremely heavy load is imposed on the sense circuit and various problems as described below have occurred. The first problem is that the construction of the sense circuit becomes complicated and the chip area may be increased in the case of forming the circuit in the integrated form. Increase in the chip area causes rise in the manufacturing cost. The second problem is that the operable power source voltage margin in the readout mode becomes small and particularly the operation on a low voltage becomes unstable. The third problem is that it becomes necessary to use a constant voltage source for supplying an intermediate voltage of +1V to the bit line. If a circuit for producing the intermediate voltage is contained in the sense circuit, the current consumption increases, thereby making it difficult to attain low power consumption. The fourth problem is that the access time will become longer as the sense circuit becomes complex in construction.

As described above, the conventional nonvolatile semiconductor memory has problems that the chip area increases, the low voltage operation becomes unstable, it is difficult to attain the low power consumption and the access time becomes longer.

SUMMARY OF THE INVENTION

An object of this invention is to provide a nonvolatile semiconductor memory which can attain a low voltage operation and low power consumption and permits peripheral circuits including a sense circuit to be formed simple in construction and operated at a high speed.

According to this invention, there is provided a nonvolatile semiconductor memory comprising a semiconductor substrate of a first conductivity type; source and drain diffusion layers formed in the substrate; a channel region provided between the source and drain diffusion layers; a first insulation film continuously formed on the channel region and the drain diffusion layer adjacent to the channel region; a floating gate layer formed on the first insulation film; a second insulation film formed on the floating gate layer and having a thin film portion which is formed thinner than the first insulation film; and a control gate layer formed on the second insulation film.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out in the appended claims.

BRIEF DESCRIPTION OF THE DRAWINGS

The accompanying drawings, which are incorporated in and constitute a part of the specification, illustrate presently preferred embodiments of the invention, and together with the general description given above and the detailed description of the preferred embodiments given below, serve to explain the principles of the invention.

FIG. 3 shows voltages in the various operation modes of the memory cell shown in FIG. 1;

FIG. 4 is a characteristic diagram showing the relation between the threshold voltage of the memory cell transistor shown in FIG. 1 and the total time in which a voltage is applied to the bit line;

FIG. 5 is a cross sectional view showing the element structure of a memory cell used in a nonvolatile semiconductor memory according to a preferred embodiment of the present invention;

FIG. 6 is a pattern plan view of the memory cell shown in FIG. 5;

FIG. 7 is a diagram showing an equivalent circuit of the element shown in FIG. 5;

FIG. 10 shows another schematic construction of the above readout-side circuit;

FIG. 11 shows still another schematic construction of the above circuit;

DETAILED DESCRIPTION OF THE PREFERRED EMBODIMENTS

Figure 1:
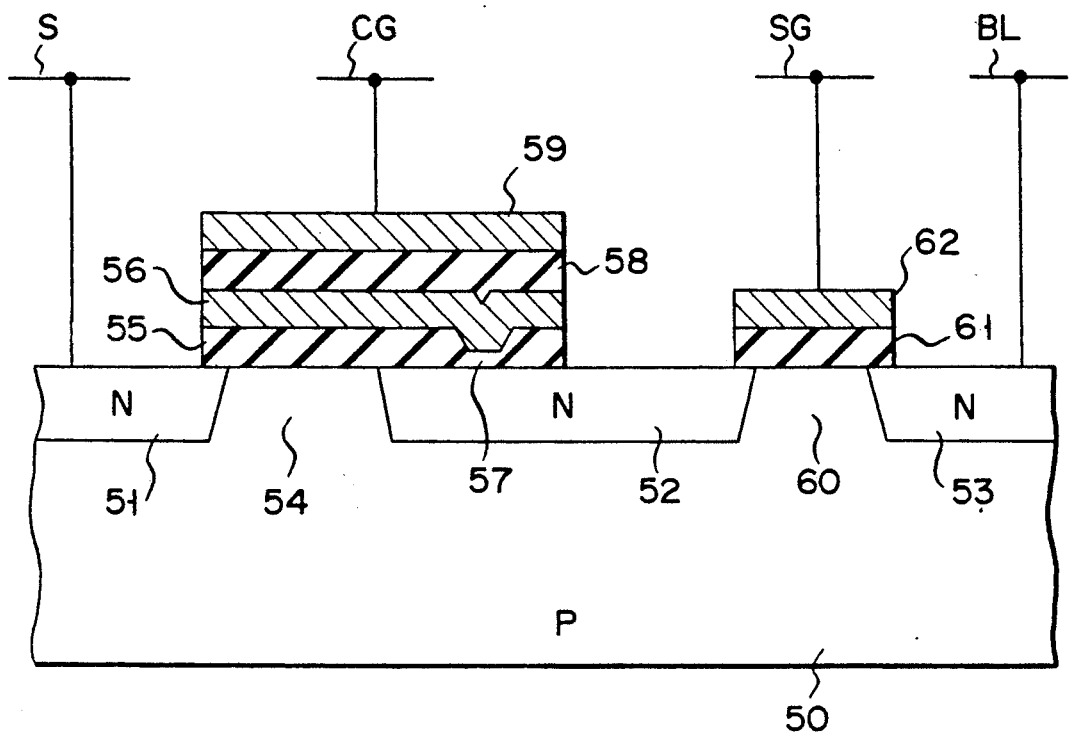
FIG. 1 is a cross sectional view showing the element structure of the conventional memory cell.
Figure 2:
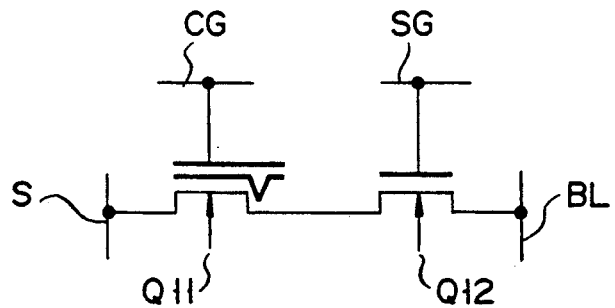
FIG. 2 is a diagram showing an equivalent circuit of the element shown in FIG. 1.

Now, a preferred embodiment of this invention is explained with reference to the accompanying drawings. FIG. 5 is a cross sectional view showing the element structure of a memory cell used in a nonvolatile semiconductor memory according to the prepared embodiment and FIG. 6 is a pattern plan view thereof. 10 denotes a P-type silicon semiconductor substrate. N-type diffusion layers 11, 12 and 13 are in the surface area of the substrate 10, and a channel region 14 is provided between the diffusion layers 11 and 12. An insulation film 15 of a silicon oxide film, for example, is continuously formed to a thickness of 400 Å on the channel region 14 and the diffusion layer 12 adjacent to the region 14. A floating gate 16 of polysilicon is on the insulation film 15. Further, an insulation film 17 of a silicon oxide film which has an approx. 400 Å thickness in a large portion thereof is disposed on the floating gate 16, and a thin film portion 18 having a film thickness of approx. 150 Å is in part of the insulation film 17 or in position corresponding to the diffusion layer 12. Further, a control gate 19 of polysilicon is disposed on the insulation film 17.

A channel region 20 is provided between the diffusion layers 12 and 13. A select gate 22 of polysilicon is formed over the channel region 20 with an insulation film 21 disposed therebetween. The insulation film 21 is of a silicon oxide film with a film thickness of approx. 400 Å, for example.

The diffusion layers 11 and 13 are respectively connected to a source line S and a bit line BL, and the control gate 19 and select gate 22 are respectively connected to a control gate line CG and a select gate line SG.

The memory cell shown in FIGS. 5 and 6 is constructed by two series-connected MOS transistors Q1 and Q2 as shown by the equivalent circuit of FIG. 7. The transistor Q1 is a floating gate type transistor having the diffusion layers 11 and 12 as the source and drain thereof and constitutes a memory cell transistor for storing data. The other transistor Q2 is an ordinary type MOS transistor having the diffusion layers 12 and 13 as the source and drain thereof and constitutes a selection transistor for selecting the memory cell transistor Q1.

Figures 8, 9:
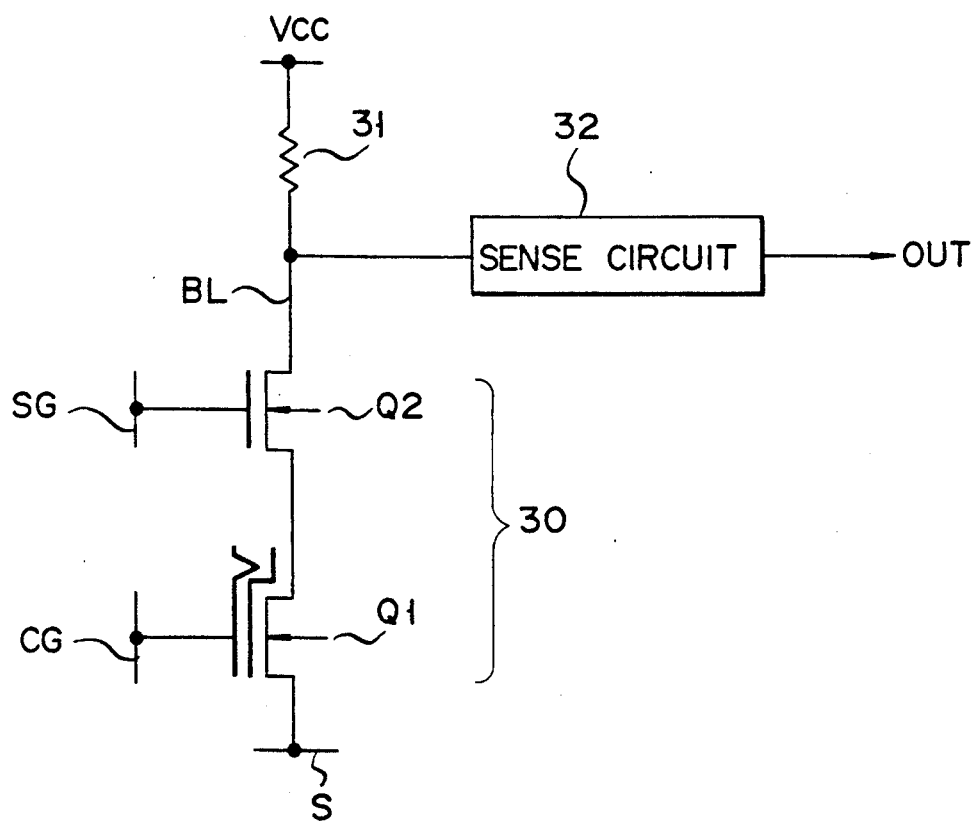
FIG. 8 is a diagram showing voltages in the various operation modes of the memory cell shown in FIG. 5.
FIG. 9 is a circuit diagram showing the schematic construction of a readout-side circuit of a nonvolatile semiconductor memory of a preferred embodiment of the present invention using the memory cell shown in FIG. 5.

Like the conventional memory cell, the memory cell with the above construction has three different operation modes, that is, electron injection, electron emission and readout modes. FIG. 8 shows voltages applied to the source line S, control gate line CG, select gate line SG and bit line BL in the respective operation modes, and the operation in each operation mode is explained below.

In the electron injection mode, voltages of +20V, +20V and 0V are respectively applied to the bit line BL, select gate line SG and control gate line CG, and the source line S is set in the electrically floating state (indicated by FL in FIG. 8). When a voltage of +20V is applied to the select gate line SG, the selection transistor Q2 is turned on and a voltage of +20V of the bit line BL is transmitted to the diffusion layer 12. At this time, a voltage of 0V of the control gate line CG is applied to the control gate 19. In this case, the potential of the floating gate 16 is determined by dividing a voltage of +20V of the diffusion layer 12 according to the capacitance ratio of a capacitance between the control gate 19 and floating gate 16 to a capacitance between the floating gate 16 and diffusion layer 12. The potential of the floating gate 16 is lower than 20V but is sufficiently higher than 0V. Therefore, an intense electric field is applied between the control gate 19 and floating gate 16 via the thin film portion 18 of the insulation film 17 so that a tunnel current may flow from the floating gate 16 towards the control gate 19, thus injecting electrons into the floating gate 16. As a result, the threshold voltage Vth of the memory cell transistor Q1 is raised.

In the case of electron emitting mode, voltages of 0V, +20V, +20V and 0V are respectively applied to the bit line BL, select gate line SG, control gate line CG and source line S. When a voltage of +20V is applied to the select gate line SG, the selection transistor Q2 is turned on and a voltage of 0V of the bit line BL is transmitted to the diffusion layer 12. At this time, the potential of the floating gate 16 is determined by dividing a voltage of the control gate 19 according to the capacitance ratio of a capacitance between the control gate 19 and floating gate 16 to a capacitance between the floating gate 16 and diffusion layer 12. The potential of the floating gate 16 is higher than 0V but is sufficiently lower than +20V. Therefore, in this case, an intense electric field is applied between the control gate 19 and floating gate 16 via the thin film portion 18 of the insulation film 17 in a direction opposite to that set in the case of the electron injection mode so that a tunnel current may flow from the control gate 19 towards the floating gate 16, thereby causing electrons to be emitted from the floating gate 16. As a result, the threshold voltage Vth of the memory cell transistor Q1 is lowered.

In the data readout mode, voltages of +5V, +5V and 0V are respectively applied to the bit line BL, select gate line SG and source line S, and the control gate line CG is set in the electrically floating state (FL). When a voltage of 5V is applied to the select gate line SG, the selection transistor Q2 is turned on and a voltage of +5V of the bit line BL is transmitted to the diffusion layer 12. At this time, if electrons are previously injected into the floating gate 1 and the threshold voltage Vth is raised, then the memory cell transistor Q1 is not turned on. Therefore, no current flows in the transistors Q1 and Q2, thereby keeping the voltage of the bit line BL at +5V.

In contrast, if electrons are previously emitted from the floating gate 16 and the threshold voltage Vth is lowered, the value of the threshold voltage Vth may be negative. At this time, the memory cell transistor Q1 is turned on. Therefore, a current flows from the bit line BL to the source line S through the transistors Q1 and Q2, causing a voltage of the bit line BL to be lowered to the voltage of 0V of the source line S. Then, in the data readout mode, data determination of logic value "1" or "0" is effected by amplifying the voltage of the bit line BL by means of a sense circuit (not shown) connected to the bit line BL.

It should be noted here that an ordinary power source voltage of +5V can be applied to the bit line BL as it is. Further, even if a voltage of +5V is applied to the bit line BL, occurrence of the soft error phenomenon can be suppressed and the read retention characteristic can be significantly improved. This is because the control gate 19 is set in the electrically floating state in the readout mode and no electric field is applied across the thin film portion 18 of the gate insulation film 17 disposed between the floating gate 16 and control gate 19 so that injection and emission of electrons due to the tunnel effect will not occur.

Next, a nonvolatile semiconductor memory of this invention using the memory cell with the construction shown in FIG. 5 is explained. FIG. 9 is a circuit diagram showing the schematic construction of a readout-side circuit of the nonvolatile semiconductor memory of this invention using the memory cell of FIG. 5. For clarifying the explanation, only one memory cell 30 which is constructed by the memory cell transistor Q1 and selection transistor Q2 is shown in FIG. 9. A resistor 31 acting as a load is connected between an ordinary readout power source Vcc of +5V and the bit line BL, and an input terminal of a sense circuit (sense amplifier circuit) 32 is connected to the bit line BL.

In the circuit of FIG. 9, the potential of the bit line BL is fully swung or changed between 5V and 0V when the data readout operation is effected in the electron injected and emitted states of the memory cell 30. That is, when a voltage of +5V is applied to the select gate line SG and the transistor Q2 is turned on, the transistor Q1 is turned off if electrons are previously injected into the transistor Q1, thereby permitting the potential of the bit line BL to be kept at 5V. In contrast, if electrons have been emitted from the transistor Q1, the transistor Q1 is turned on, thereby setting the potential of the bit line BL to 0V. Then, the potential of the bit line BL is detected by the sense circuit 32 and output as data.

At this time, even if the level of the power source voltage Vcc is lowered, the potential of the bit line BL will be substantially fully swung between Vcc and 0V. Therefore, a sufficiently large operation margin can be attained even in the low voltage operation in which the operation is effected with the level of the power source voltage Vcc lowered. Further, since an intermediate voltage of +1V which is required in the prior art is not necessary, it is not necessary to form a circuit for creating such an intermediate voltage and the current consumption can be reduced.

FIG. 10 is a circuit diagram showing the schematic construction of another readout-side circuit of the memory of a preferred embodiment of the invention using the memory cell of FIG. 5. In this memory, a P-channel MOS transistor 33 is used instead of the resistor 31 as the load circuit of the bit line BL. A ground voltage of 0V is applied to the gate of the transistor 33 to normally set the transistor 33 in the conductive state. In this way, it is possible to use a MOS transistor as the load circuit of the bit line BL.

FIG. 11 is a circuit diagram showing the schematic construction of still another readout-side circuit of the memory of this invention using the memory cell of FIG. 5. In this circuit, a clock signal $\phi p$ is supplied instead of the ground voltage to the gate of the P-channel MOS transistor 33 which is used as the load circuit of the bit line BL and the transistor 33 is turned on when required. Further, the select gate line SG of the selection transistor Q2 in the memory cell 30 is connected to an output terminal of a decoder circuit 34 acting as a combination circuit for supplying a selection signal in response to an input address. The operation of the decoder circuit 34 is also controlled by the clock signal $\phi p$.

Figure 12:
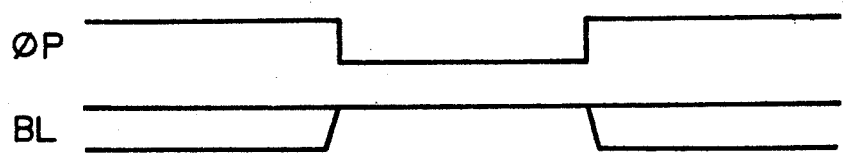
FIG. 12 is a timing chart of the circuit shown in FIG. 10.

In the circuit of FIG. 11, the clock signal $\phi p$ is set to "0" level in the precharging period as shown in the timing chart of FIG. 12 so as to turn on the transistor 33. As a result, the potential of the bit line BL is precharged to Vcc. In the next logically enabling period (in which $\phi p = $ "1"), the transistor 33 is turned off to complete the operation of precharging the bit line BL. Further, in this period, the decoder circuit 34 becomes operative and sets the select gate line SG to 5V or 0V in response to the input address. When the select gate is set to a voltage of 5V, the selection transistor Q2 in the memory cell 30 is turned on to select the memory cell 30.

Figure 13:
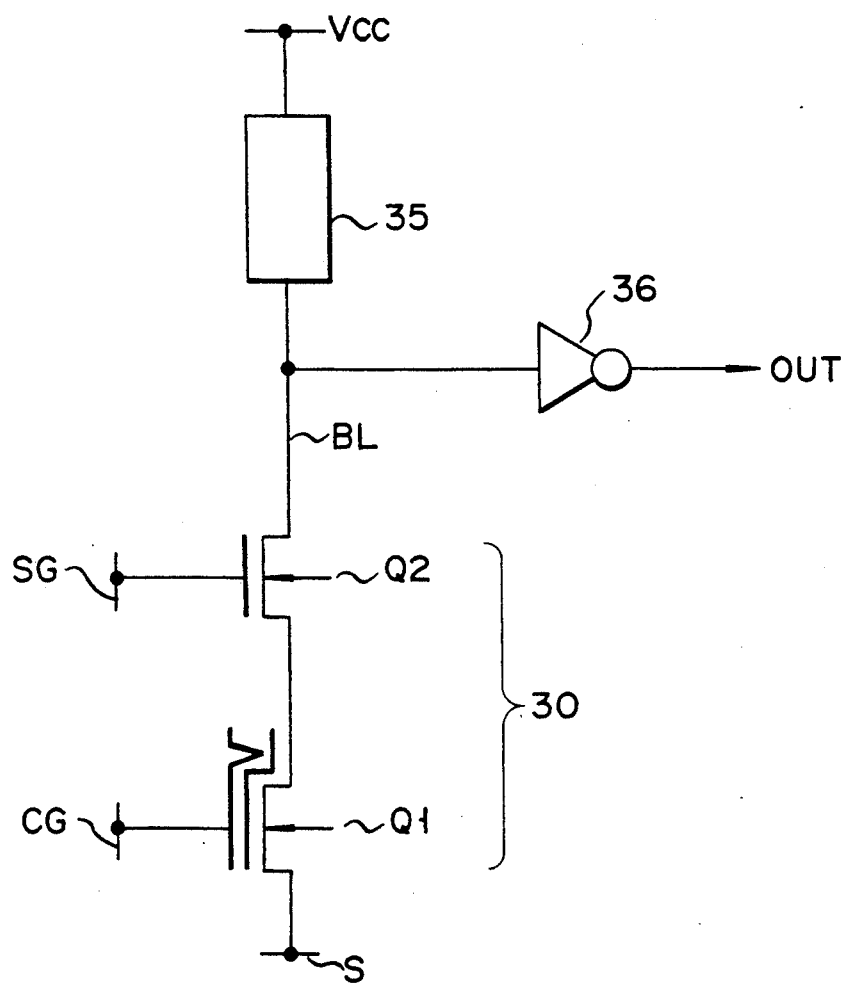
FIG. 13 is a circuit diagram showing the schematic construction of a readout-side circuit of a nonvolatile semiconductor memory of a preferred embodiment of the present invention using the memory cell shown in FIG. 5.

FIG. 13 is a circuit diagram representing the sense circuit 32 available in each of the circuits of FIGS. 10 and 11 together with the memory cell 30. In this case, a load circuit 35 connected between the power source terminal Vcc and bit line BL corresponds to the resistor 31 in FIG. 9, and the P-channel MOS transistor 33 in FIGS. 10 and 11.

In other words, since the potential of the bit line BL is fully swung between 5V and 0V when any type of load is connected between the power source terminal Vcc and bit line BL, it is not necessary to use a sense circuit with a complicated structure which has been required in the prior art for amplifying a small potential difference. For example, as shown in FIG. 13, it is possible to use a simple inverter 36 constituted by MOS transistors as the sense circuit. Therefore, the sense circuit can be simplified and the access time can be shortened.

Figure 14:
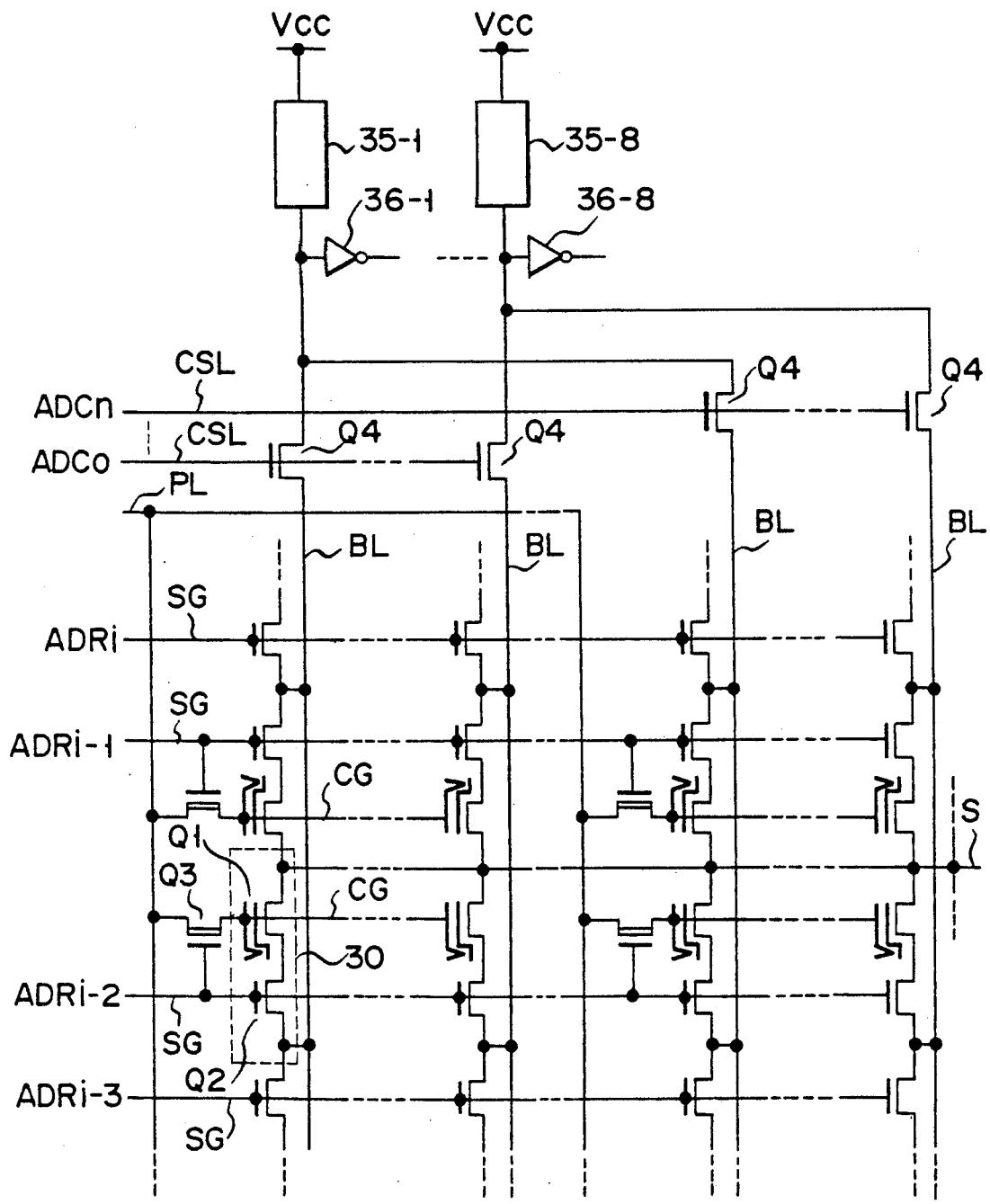
FIG. 14 is a circuit diagram showing the construction of a memory cell array portion of a memory of a preferred embodiment of the present invention using a large number of memory cells having the same construction as the memory cell shown in FIG. 5.

FIG. 14 shows the construction of a memory cell array of a memory of this invention using a large number of memory cells having the same construction as shown in FIG. 5. In this memory cell array, (n+1) groups each of which includes eight memory cells each constituted by two MOS transistors Q1 and Q2 are arranged in a lateral direction and a preset number of memory cells 30 are arranged in a vertical direction. Row address decoding signals ADRi, ADRi-1, ADRi-2, ADRi-3, --- output from a row address decoder (not shown) are supplied to the respective select gate lines SG of the memory cells 30. Further, a voltage of a program line PL is applied to the respective control gate lines CG of the memory cells 30 via respective depletion type MOS transistors Q3. The program line PL is applied with a voltage of 0V and +20V in the data erasing mode and programming mode, respectively and set into the electrically floating state in the data reading mode.

The eight bit lines BL of each group are selected by eight column selection MOS transistors Q4. The gates of the eight column selection MOS transistors Q4 are commonly connected to a corresponding one of column select lines CSL and the conduction states of the transistors Q4 are controlled by column address decoding signals ADC0 to ADCn output from a column address decoder (not shown). Data read out and supplied to the eight bit lines BL selected by the eight column selection MOS transistors Q4 of one group are sensed by means of eight inverters 36-1 to 36-8. In FIG. 14, 35-1 to 35-8 denote load circuits which correspond to the resistor 31 in FIG. 9, and the P-channel MOS transistor 33 of FIGS. 10 and 11.

As described above, according to this invention, it is possible to provide a nonvolatile semiconductor memory which can attain a low voltage operation and low power consumption, simplify the construction of peripheral circuits such as sense circuits and enhance the operation speed thereof.

Additional advantages and modifications will readily occur to those skilled in the art. Therefore, the invention in its broader aspects is not limited to the specific details, and representative devices, shown and described herein. Accordingly, various modifications may be made without departing from the spirit or scope of the general inventive concept as defined by the appended claims and their equivalents.

What is claimed is:

1. A nonvolatile semiconductor memory comprising:
   a semiconductor substrate of a first conductivity type;
   source and drain diffusion layers in said substrate;
   a channel region between said source and drain diffusion layers;
   a first insulation film continuously on said channel region and said drain diffusion layer adjacent to said channel region and having a first thickness;
   a floating gate layer on said first insulation film;
   a second insulation film on said floating gate layer, a thin film portion of said second insulation film having a thickness less than the first thickness and a remaining portion of said second insulation film having a thickness substantially equal to the first thickness; and
   a control gate layer on said second insulation film.

2. A nonvolatile semiconductor memory according to claim 1, wherein the film thickness of said thin film portion of said second insulation film is such that a tunnel current may flow in said thin film portion when an electric field of a predetermined intensity is applied between said control gate layer and said drain diffusion layer.

3. A nonvolatile semiconductor memory comprising:
   a semiconductor substrate of a first conductivity type;
   a first, second and third diffusion layers of a second conductivity type in said substrate;
   a first channel region between said first and second diffusion layers;
   a second channel region between said second and third diffusion layers;
   a first insulation film continuously on said first channel region and said second diffusion layer adjacent to said first channel region and having a first thickness;
   a floating gate layer on said first insulation film;
   a second insulation film on said floating gate layer, a thin film portion of said second insulation film having a thickness less than the first thickness and a remaining portion of said second insulation film having a thickness substantially equal to the first thickness;
   a control gate layer on said second insulation film;
   a third insulation film on said second channel region and having a film thickness substantially equal to the first thickness;
   a selection gate layer on said third insulation film;
   a control gate line for applying preset voltages to said control gate layer int he data programming, erasing and readout modes;
   a selection gate line for applying preset voltages to said selection gate layer in the data programming, erasing and readout modes;
   a source line for applying a preset voltage to said first diffusion layer; and
   a bit line for applying preset voltages to said third diffusion layer in the data programming, erasing and readout modes.

4. A nonvolatile semiconductor memory according to claim 3, wherein the film thickness of said thin film portion of said second insulation film is such that a tunnel current may flow in said thin film portion when an electric field of a predetermined intensity is applied between said control gate layer and said drain diffusion layer.

5. A nonvolatile semiconductor memory comprising:
   a semiconductor substrate of a first conductivity type;
   a first, second and third diffusion layers of a second conductivity type in said substrate;
   a first channel region between said first and second diffusion layers;
   a second channel region between said second and third diffusion layers;
   a first insulation film continuously on said first channel region and said second diffusion layer adjacent to said first channel region and having a first thickness;
   a floating gate layer on said first insulation film;
   a second insulation film on said floating gate layer, a thin film portion of said second insulation film having a thickness less than the first thickness and a remaining portion of said second insulation film having a thickness substantially equal to the first thickness;
   a control gate layer on said second insulation film;
   a third insulation film on said second channel region and having a film thickness substantially equal to the first thickness;
   a selection gate layer on said third insulation film;
   a control gate line for applying preset voltages to said control gate layer in the data programming, erasing and readout modes;
   a selection gate line for applying preset voltages to said selection gate layer in the data programming, erasing and readout modes;
   a source line for applying a preset voltage to said first diffusion layer; and
   a bit line for applying preset voltages to said third diffusion layer in the data programming, erasing and readout modes;
   a power source node supplied with a power source potential;
   a load circuit connected between said bit line and power source node; and
   a sense circuit connected to said bit line, for detecting the potential of said bit line.

6. A nonvolatile semiconductor memory according to claim 5, wherein the film thickness of said thin film portion of said second insulation film is such that a tunnel current may flow in said thin film portion when an electric field of a predetermined intensity is applied between said control gate layer and said drain diffusion layer.

7. A nonvolatile semiconductor memory according to claim 6, wherein said load circuit is a resistor.

8. A nonvolatile semiconductor memory according to claim 6, wherein said load circuit is constituted by a MOS transistor which is normally set conductive.

9. A nonvolatile semiconductor memory according to claim 6, wherein said load circuit is constituted by a MOS transistor which is controlled to be temporarily rendered conductive in response to a clock pulse.

10. A nonvolatile semiconductor memory according to claim 6, further comprising a combination circuit which is controlled by the clock pulse signal and is supplied with an address signal and which supplies an output signal to said selection gate line.

11. A nonvolatile semiconductor memory according to claim 4, wherein said sense circuit is an inverter circuit.

* * * * *